United States Patent [19]

Merchant

[11] Patent Number: 4,668,597
[45] Date of Patent: May 26, 1987

[54] DORMANT TONE IMAGING

[76] Inventor: Timothy P. Merchant, 5307 Indian Rock Rd., Centreville, Va. 22020

[21] Appl. No.: 829,980

[22] Filed: Feb. 18, 1986

Related U.S. Application Data

[63] Continuation of Ser. No. 671,690, Nov. 15, 1984, abandoned.

[51] Int. Cl.$^4$ .......................... G03F 7/02; G03F 9/00; F16L 35/00; F16L 55/00
[52] U.S. Cl. .................................. 430/22; 101/450.1; 283/67; 283/93; 283/902; 430/10; 430/302; 430/952
[58] Field of Search .................... 430/22, 301, 10, 952; 283/67, 93, 902; 101/450.1, 468

[56] References Cited

U.S. PATENT DOCUMENTS

| | | | |
|---|---|---|---|
| 1,002,600 | 9/1911 | Morris et al. | 283/902 |
| 3,675,948 | 7/1972 | Wicker | 283/902 |
| 4,176,859 | 12/1979 | Giordano | 283/902 |
| 4,310,180 | 1/1982 | Mowry et al. | 283/902 |

Primary Examiner—Richard L. Schilling
Attorney, Agent, or Firm—Dennis H. Lambert

[57] ABSTRACT

An object of this invention is to provide a method of producing printing with a hidden image which cannot be observed with the unaided eye but which can be observed by use of a tool to determine the authenticity of a document.

In accordance with the invention, the lithographic printing process is used in conjunction with tints or halftones to produce a printed document having an image therein which is not detectable with the unaided eye, but which may be observed when the print is viewed through a tint screen. The hidden image is produced by making a composite negative comprising an exposure through a negative containing the image and a tint oriented at a first angle onto a piece of film, and then making a second exposure through a positive containing the image and a tint oriented at a second angle onto the same piece of film. The composite negative is enlarged and dots in the area of the intersection of the image and background are blended to hide the image. Thereafter, the print is reduced to render the image invisible to the unaided eye.

8 Claims, 6 Drawing Figures

DORMANT TONE IMAGING

This is a continuation of application Ser. No. 671,690, filed Nov. 15, 1984, now abandoned.

TECHNICAL FIELD

This invention relates to hidden image printing, and particularly, to a method of printing security documents in a manner to discourage counterfeiting of the documents.

There are many uses of documentation which require some form of security feature to prevent counterfeiting. For instance, stock certificates, checks, title instruments and other negotiable instruments are subject to being photocopied with the copiers available today, and skilled counterfeiters can reproduce these documents with little effort. Moreover, security firms and government agencies have need for counterfeit-proof identity documents.

BACKGROUND ART

Several approaches have been used in the prior art to prevent counterfeit reproduction of such documents, including intaglio printing methods such as used on various banknotes and the like, and halftone imaging.

Intaglio printing requires expensive steel engraving and substantially increases the cost of the document using this method. The use of halftone printing is inexpensive and various methods of using the technique are disclosed in U.S. Pat. Nos. 3,675,948, 4,265,469 and 4,310,180. Other methods of producing non-counterfeitable documents are disclosed in U.S. Pat. Nos. 4,176,859 (different line screen frequencies), 1,002,600 (overlaying parallel lines disposed at different angles), and 4,246,307 (laminated sheets with spaced adhesive zones to damage the sheets in the event of tampering).

The halftone printing method described in Wicker, U.S. Pat. No. 3,675,948, requires the use of multiple halftones or tints. In this patent, a concentric rosette pattern is produced. This phenomenon occurs naturally and is a usual feature of multiple color half-tone printing. However, it is not a natural feature for single color halftones or tints. Instead, this feature (a rosette pattern) in a single color security printing would be suspect, perhaps leading a counterfeiter to the method for duplicating the security feature.

The line printing method described in Morris, et al, U.S. Pat. No. 1,002,600, prints overlays with multiple lines disposed at an angle to one another in different overprints. A special screen is required for viewing the hidden image. However, the screen is not a tint and the use of the screen does not produce a "moire" effect. Moreover, the image is not totally hidden in this method with one color printing.

It is desirable to produce documents in which a security feature is provided that does not substantially increase the cost of the document and which cannot be readily reproduced by counterfeiter, and further, which does not require any special lighting or conditions to make a validity check.

DISCLOSURE OF THE INVENTION

In accordance with the present invention, a printing process is used in which tones or tints are used to represent percentages of colors, particularly the lithographic process. In the invention, screen tints are used to produce a composite negative consisting of linear arrays of dots with a hidden image being produced by an array of dots disposed at a predetermined angle relative to the array of dots forming the background on the document. The hidden image may be viewed by using a screen of similar frequency and density as the printed image, wherein the screen is angularly displaced relative to the document to product a "moire" effect, causing the image to stand out.

A print is made from the composite negative and then enlarged. In the enlarged print, visible aberrations in the dot pattern at the interface or intersection between the angularly disposed arrays of dots can be manually altered to reduce the visible impact of such aberrations, i.e. overlapped dots, elongated dots. etc. Thereafter, when the print is reduced to its original size, the image is virtually invisible to the eye and can be observed by use of a screen.

After printing, the hidden image is impossible to observe with the naked eye, and even magnifications of the image generally will not reveal the hidden image, particularly under any degree of magnification likely to be utilized. Further, even if the method of the invention is discovered, counterfeits may be detected if the precise angles used in producing the secure document are not duplicated.

BRIEF DESCRIPTION OF THE DRAWINGS

Details of the invention will be described in connection with the accompanying drawings, in which.

BEST MODE FOR CARRYING OUT THE INVENTION

Figure 1:
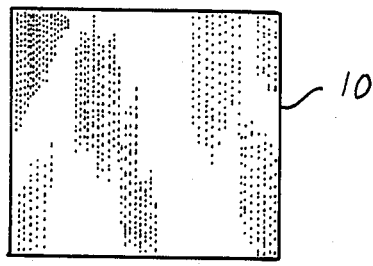
FIG. 1 is a somewhat schematic view of a print incorporating a hidden image therein in accordance with the invention.
Figure 2:
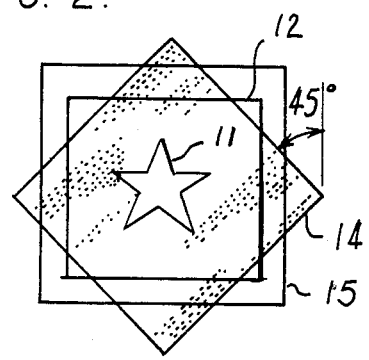
FIG. 2 is a schematic view showing a step in the method of producing the invention.
Figure 3:
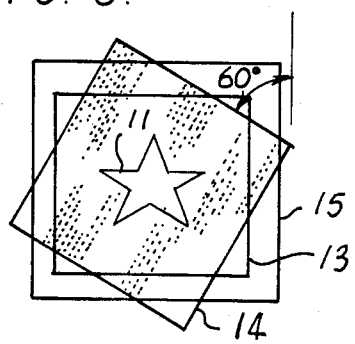
FIG. 3 is a schematic view of a further step in the method of producing the invention.
Figure 4:
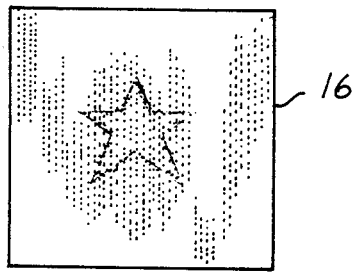
FIG. 4 is a schematic view of a still further step in the method of producing the invention.
Figure 5:
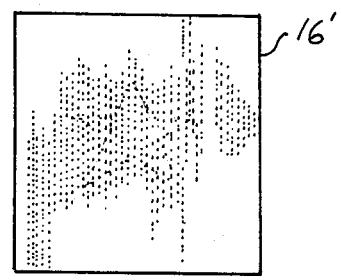
FIG. 5 is a schematic view of a final step in the method of producing the invention, showing the image and background prior to reduction to the final form as shown in FIG. 1.

A print 10 containing a hidden image 11 in accordance with the invention is shown in FIG. 1. The print 10 is produced in accordance with the steps shown schematically in FIGS. 2 through 5.

In producing the print with hidden image, a composite negative (not shown) is made by first photographing the image 11 (a star in the example shown and described herein) into a negative format 12. A positive 13 is then made from the negative. The positive and negative are aligned with one another via suitable means, such as register pins or the like (not shown).

After the positive and negative are perfectly aligned, a first exposure is made through the negative 12 and a screen tint 14 onto a piece of film 15. The screen tint is preferably 100 line frequency or greater, and is disposed at an angle of 45°. See FIG. 2.

A second exposure is then made onto the same piece of film 15 through the positive 13 and the screen tint 14, which is now disposed at an angle of 60°. See FIG. 3. A different frequency tint may be used for the second exposure, if desired, if care is taken to prevent visible density shifts.

The film 15 is then processed in the normal manner and a print is made from the composite film (negative) 16 which is enlarged several hundred percent (900%, for example), to a point that the image will be of such size as to be readily visible. See FIG. 4. As can be seen in this figure, the intersection between the two exposures made with the dots at different angles has several aberrations therein with some dots overlapping and others being oblong, etc. These aberrations are eliminated by altering the dots in the area of the intersection to produce a relatively smooth transition between the two zones, i.e. background and image. See FIG. 5, print 16'.

After the dots are altered, the print 16' is reduced to the desired size to provide the final print 10, FIG. 1.

Figure 6:
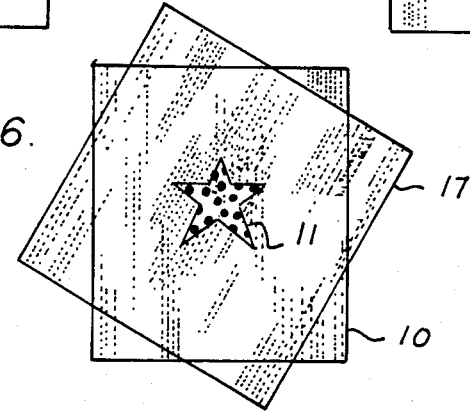
FIG. 6 is a schematic view of the invention, showing a viewing screen being used with the print of FIG. 1 in order to produce the "moire" effect and render the hidden image visible.

The image 11 remains invisible until a screen tint 17 of the same frequency as used to create the image is placed in proximity with the print and rotated to produce a moire effect, as shown in FIG. 6.

Although the invention as described above relates to the use of screen tints, the method is also applicable in single color halftones.

Moreover, a common occurrence found in printing, referred to as "dot gain", is used to advantage in the invention. Dot gain is the difference in dot size from negative to reproduction, which is generally attributable to absorption of ink by the paper. For example, as noted previously, in the process of making the composite, many half dots, oblong dots, etc. will be produced around the edge of the image. These dots must be removed and new dots strategically substituted for them. The object of strategically placing the dots or blending the dots in the area of transition from background to image is to avoid the harshness of the angle between the dots in these two zones. Whenever an averge diameter dot is used, spacing between dots must be equal or excess density and/or voids in the tint will be created. At no time is an above average diameter dot used. In the printing stage the tint should look as smooth and even (density) as possible. This helps avoid the attention of a potential counterfeiter. The closer the tint appears to a normal reproduction tint, the less chance of detecting the security feature. In most cases, the image will be very faint in the final negative stage. The final step of totally hiding the image occurs during the plate making and printing processes, when the natural phenomenon known as dot gain removes any trace of the image by the unaided eye. For instance, during the plate making process and again when the tint is printed, the dots gain in size. They also lose their degree of perfect roundness. Thus, the tint in its final printed stage does not have the degree of resolution to make the image visible to the unaided eye.

Under some circumstances, less absorbent paper and better printing conditions will require negatives with the image closer to being totally hidden. In this case, some "dot gain" may be "built in" at the negative stage. This can be done by plating and printing a negative with a very faint image onto a more absorbent paper in a good reproduction color. The printed sheet can then be photographed, producing the "built in" dot gain for transfer to the less absorbent sheet.

Dot gain and distortion, being present in all reproductions of the hidden image, provide one natural counterfeit deterrent. A photographic copy of a previously printed hidden image would obviously suffer in quality, particularly tonal density shifts. In single color printing of a hidden image, it is desirable to use a screen tint of high frequency and high percentage, i.e. 100 lines per inch or greater and 80-90%. These frequencies and tints make photographic counterfeiting extremely difficult, if not impossible.

When used in combination with multiple color printing, there are additional deterrents to photographic counterfeiting. The primary goal, when using additional colors, is to prevent filtration of the hidden image. Printing a solid (no dots) translucent ink either under or over the hidden image will make filtration of the image extremely difficult, provided the two colors are very similar in spectral response.

In addition to or in place of color, other deterrents are possible in the creation of the hidden image itself. An outline of the hidden image (type or figure) may be produced in register over top of the hidden image either in the same color or a separate color. This can be accomplished without correcting the undesirable dots created in the initial composite negative. The outline will hide these. The outline may also be used as a "knock out" to remove the undesirable dots, letting the paper or background color display the outline. In either case, the counterfeiter would not be aware of the hidden image that would "moire" differently in the space bounded by the outline than would the background around it.

Further, various types of insignia or art work could be printed over the hidden image, further disguising the hidden image. Care should be taken to prevent obstructing the hidden image beyond recognition. Using this type of overprint would require correction of the undesirable dots since the overprint would not be in register with the outline of the hidden image.

In the event a counterfeiter discovers the method of the invention, a check can be made on the authenticity of the document by measuring the angular relationship between the image and background. In other words, it is highly unlikely that the counterfeiter would match the exact angular relationship, in addition to all of the other parameters which would need to be duplicated exactly.

The viewing apparatus for detecting the hidden image comprises the same material as used to create the image. A screen tint is preferred also for viewing halftones because of the substantially lower cost for a tint as compared with a halftone screen. When viewing the image, 20-30% tints of the same frequency as used to create the image produce the best results. Tints of different frequencies and percentages will work, but not as well.

When viewing the image, the screen tint is placed on top of the printing and angled back and forth. During this process, the image will alternately go into and out of focus. Stopping the tint with the image in focus enables continued viewing of the image in order to ascertain the validity of the document. Focusing of the image coincides with the moire effect, showing either a small dot image with large dot background, or a large dot image with small dot background.

Viewing of the image may be done in normal room light, without any special equipment other than the tint screen. However, viewing may be done in a housing containing a light souce with a tint fixed at a predetermined. angle and viewpoint.

It should be noted that it is not essential that the tints be placed at the precise angles of 45° and 60°, respectively, during creation of the hidden image, as any angle difference will work, but the difference between the two angles should be 15° or close thereto for best results.

I claim:

1. A method of producing a hidden image in a printed screen tint composed of a linear formation of dots, comprising the steps of:
   exposing a film negative containing said image through a screen tint oriented at a predetermined angle to a piece of film;
   exposing in register to the first exposure a film positive containing said image through a screen tint oriented at a second predetermined angle to the same piece of film, thereby producing a composite negative;
   making a print from the composite negative;
   enlarging and altering the dot structure in the area of the intersection between the image and background in an attempt to hide the image; and
   reducing the print by means of a negative to a production size, rendering the image invisible to the unaided eye when the negative is printed.

2. A method of producing a hidden image as in claim 1, wherein:
   an outline of the image is exposed onto the piece of film to obscure or knock out the dots in the area of transition between the image and background.

3. A method of producing a hidden image as in claim 2, including the step of:
   printing a solid color background.

4. A method of producing a hidden image as in claim 2, including the step of:
   printing a solid translucent color overprint.

5. A method of producing a hidden image in a printed halftone composed of a linear formation of dots, comprising the steps of:
   exposing a film negative containing said image through a single color halftone oriented at a predetermined angle to a piece of film;
   exposing in register to the first exposure a film positive containing said image through a single color halftone oriented at a second predetermined angle to the same piece of film, thereby producing a composite negative;
   making a print from the composite negative;
   enlarging and altering the dot structure in the area of the intersection between the image and background in an attempt to hide the image; and
   reducing the print by means of a negative to a production size, rendering the image invisible to the unaided eye when the negative is printed.

6. A method of producing a hidden image as in claim 1, wherein:
   the difference between the predetermined angles is about 15°.

7. A method of producing a hidden image as in claim 6, wherein:
   the first predetermined angle is about 45° and the second predetermined angle is about 60°.

8. A method of producing a hidden image as in claim 5, wherein:
   the difference between the predetermined angles is about 15°.

* * * * *